United States Patent [19]

Roberto

[11] Patent Number: 4,478,882
[45] Date of Patent: Oct. 23, 1984

[54] METHOD FOR CONDUCTIVELY INTERCONNECTING CIRCUIT COMPONENTS ON OPPOSITE SURFACES OF A DIELECTRIC LAYER

[75] Inventor: Scorta Roberto, Milan, Italy

[73] Assignee: Italtel Societa Italiana Telecomunicazioni S.P.A., Milan, Italy

[21] Appl. No.: 384,499

[22] Filed: Jun. 3, 1982

[51] Int. Cl.³ .............................................. H05K 3/40
[52] U.S. Cl. ..................................... 427/97; 427/238; 118/50; 118/406; 118/408
[58] Field of Search ................. 427/97, 238, 294, 296; 118/406, 408, 50; 29/852

[56] References Cited

U.S. PATENT DOCUMENTS

| | | | |
|---|---|---|---|
| 3,160,930 | 12/1974 | Fisher | 29/825 X |
| 3,268,653 | 8/1966 | McNutt | 427/97 X |
| 3,650,804 | 3/1972 | Parisi | 427/294 |
| 4,064,290 | 12/1977 | Ebel et al. | 427/97 |

Primary Examiner—John D. Smith
Assistant Examiner—Bernard F. Plantz
Attorney, Agent, or Firm—Karl F. Ross; Herbert Dubno

[57] ABSTRACT

A layer of dielectric material, carrying printed or thick-film circuit components on opposite surfaces, is provided with one or more bores extending between aligned circuit points to be conductively interconnected. The layer is sandwiched between two masks having a perforation of larger diameter in line with each bore, such perforation communicating with a respective chamber in an adjoining member forming part of a pair of clamp jaws pressing the masks against the layer. A conductive liquid or paste in one chamber is pumped through each bore from one chamber into the other, via the adjoining perforations, by the respective application of pressure and suction to these chambers with the aid of membranes or pistons moving codirectionally in one or more strokes.

4 Claims, 2 Drawing Figures

METHOD FOR CONDUCTIVELY INTERCONNECTING CIRCUIT COMPONENTS ON OPPOSITE SURFACES OF A DIELECTRIC LAYER

FIELD OF THE INVENTION

My present invention relates to a method of conductively interconnecting circuit components on opposite surfaces of a dielectric layer, e.g. a substrate of alumina, epoxy resin or the like serving as a carrier for thick-film or printed circuitry.

BACKGROUND OF THE INVENTION

In thick-film circuitry, conductor strips are formed on a substrate surface from electrically conductive pastes or inks usually applied by screen printing. The substrate so coated is then subjected to a heat treatment designed to dry the applied mass and to facilitate its juxtaposition with similar substrates. In many instances it is necessary to coat both surfaces of a substrate in this manner and to provide conductive connections between aligned circuit points thereof. One possible way is to drive a metallic staple through the substrate in contact with opposite patches of conductive material; this procedure is cumbersome especially when a large number of connections are to be made. Another possibility is to provide the substrate with a bore in line with the circuit points to be interconnected and to contact these points by the heads of a metallic rivet inserted into that bore; this creates difficulties where, because of space limitations, the diameter of the bore must be very small.

A simpler and more convenient solution is to fill such a bore with conductive ink and let it dry. The conductive plugs so formed, however, do not establish a reliable connection since they tend to shrink during the heat treatment which may cause them to rupture in the middle or to break away from one or the other conductor strip to be contacted thereby.

OBJECTS OF THE INVENTION

Thus, the object of my invention is to provide an improved method of conductively interconnecting such circuit points with avoidance of the aforestated drawbacks.

SUMMARY OF THE INVENTION

In accordance with my present invention, a dielectric layer (e.g. a ceramic or resinous substrate as discussed above) is provided with a bore extending between aligned points of circuit components on opposite surfaces of that layer. With the layer sandwiched between two masks each having a perforation in line with the bore, the assembly is clamped between two members (referred to hereinafter as jaws) having respective fluid chambers in communication with those perforations. After one chamber has been filled with an electrically conductive flowable mass, that chamber is pressurized while suction is applied to the other chamber to drive some of the mass through the bore via the perforated masks with resulting conductive bridging of the bore ends.

If a single pass is not sufficient, the last step may be followed by one or more inversions of suction and pressure applied to the chambers whereby additional conductive material is forced through the bore. The procedure is terminated when the mass not only fills the bore but projects from opposite ends thereof to establish good contact with the conductors to be interconnected. Advantageously, the perforations of the masks are somewhat wider than the bore so that the resulting conductive plug ends in enlarged patches partly overlying the adjoining conductor strips. The bore or bores can be formed either before or after the layer is sandwiched between the two masks.

A device for implementing the aforedescribed method comprises clamping means for holding a dielectric circuit-carrying layer sandwiched between a pair of perforated masks, the clamping means including a pair of jaws formed with respective chambers which are open toward the perforations of the masks and are each bounded by a movable wall such as an elastic membrane or a reciprocably guided piston. The two movable walls are operatively coupled with pumping means for reducing the volume of one chamber while concurrently enlarging the volume of the other chamber whereby a conductive flowable mass in that one chamber is forced through the bore or bores of the dielectric layer by way of the masked perforations aligned therewith.

The same method and device can be used with printed-circuit substrates provided, for example with a so-called ground plane in the form of a copper coating on one surface and with a conductor array on the other surface formed by selective electrolytic deposition or by etching. This eliminates the need for conductively lining bores of the substrate by the rather cumbersome process of immersion in a copper bath.

BRIEF DESCRIPTION OF THE DRAWING

The above and other features of my invention will now be described in detail with reference to the accompanying drawing in which.

SPECIFIC DESCRIPTION

Figure 1:
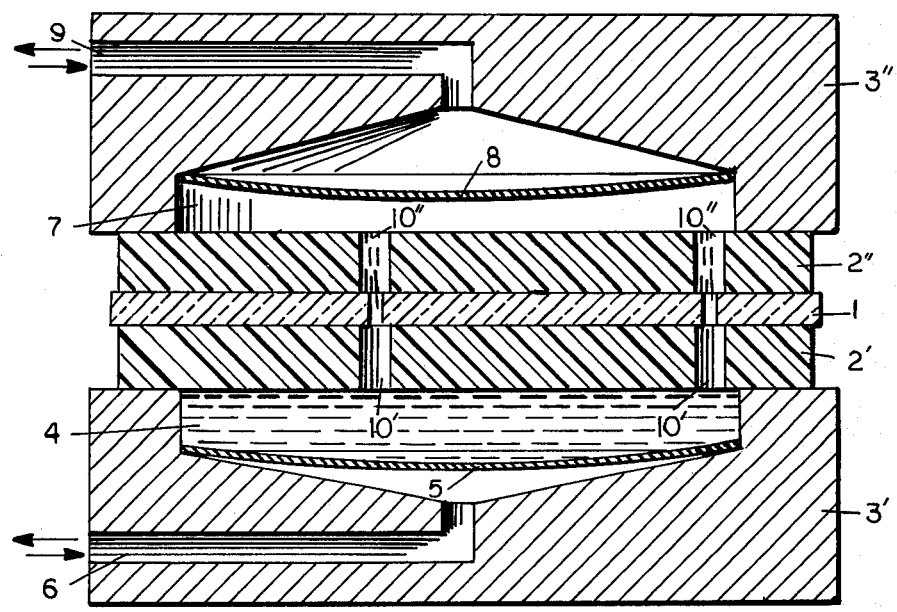
FIG. 1 is a somewhat diagrammatic cross-sectional view of a device for conductively interconnecting aligned circuit points on opposite surfaces of a dielectric layer in accordance with my present invention.

In FIG. 1 I have shown a dielectric substrate 1 with a plurality of narrow bores 11 which is sandwiched between two semirigid masks 2' and 2", e.g. of acrylic resin, having respective perforations 10' and 10" in line with these bores. The perforations 10' and 10", it will be noted, are of substantially larger diameter than the bores. The three layers 1, 2' and 2", whose thickness has been exaggerated in the drawing for clarity's sake, are held by a nonillustrated clamping mechanism between two metallic blocks 3', 3" provided with respective chambers 4 and 7. These chambers, communicating with the corresponding perforations 10' and 10", are sealed by respective elastic membranes 5 and 8 against two conduits 6 and 9 leading to a nonillustrated source of reversible fluid pressure. After chamber 4 has been filled with conductive ink or paste, pressure of a working fluid (e.g. air) in conduit 6 coupled with a partial vacuum in conduit 9 drives some of the conductive mass through perforations 10', bores 11 and perforations 10" into chamber 7 to form a conductive plug in each bore 11 with enlarged heads extending into the adjoining perforations. These heads, serving as conductive patches establishing the necessary contact with respective conductor strips on substrate 1, also provide a sufficient reserve of material to prevent a rupture of the plug during the subsequent heat treatment.

The pressurization of conduit 6 and the simultaneous evacuation of conduit 9 inverts, of course, the illustrated deflection of the membranes. As indicated by the arrows, however, the fluid flow in these conduits can then be reversed to restore the original membrane curvature, and one or more similar cycles may follow if necessary. Advantageously, the stroke of membrane 8 is increased over that of membrane 5 to compensate for the weight of the conductive mass.

Figure 2:
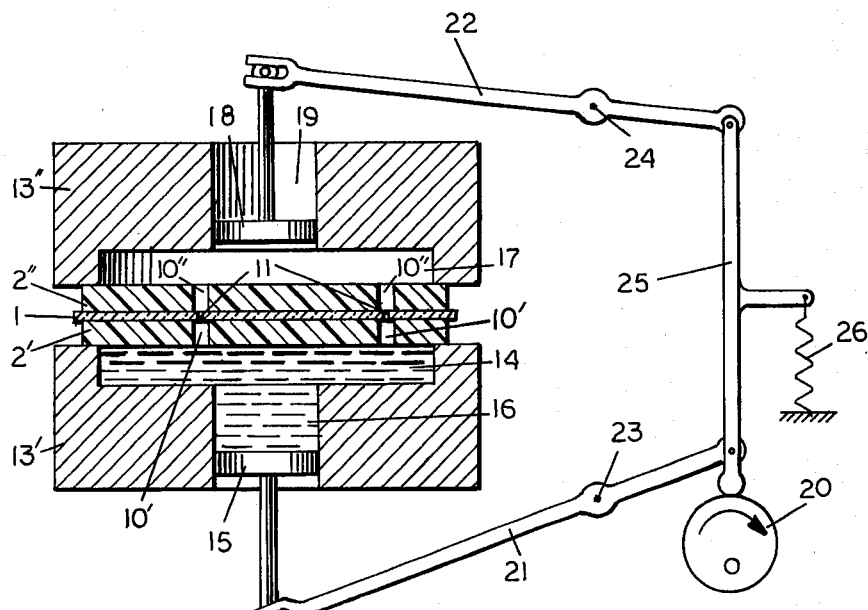
FIG. 2 is a view generally similar to that of FIG. 1, illustrating a modification.

In a modified device according to my invention illustrated in FIG. 2, the sandwich 1, 2', 2'' is clamped between two jaws 13', 13'' with chambers 14, 17 which communicate with cylinders 16 and 19 wherein pistons 15 and 18 are slidable. These pistons are linked by respective levers 21 and 22, having fulcra 23 and 24, with a rod 25 held by a spring 26 in contact with the peripheral surface of a rotatable cam 20. Each rotation of the cam corresponds to a codirectional reciprocation of pistons 15 and 18, resulting in the alternate pressurization and evacuation of chambers 14 and 17. Again, the pressure change in the upper chamber 17 can be intensified with reference to that in the lower chamber 14, e.g. by enlarging the cylinder 19 relatively to the cylinder 16 to counterbalance at least in part the effect of gravity.

Naturally, any number of parallel chambers bounded by membranes or pistons may be provided in each clamp jaw for simultaneous treatment of a plurality of circuit carriers.

I claim:

1. A method of conductively interconnecting aligned points of circuit components on opposite surfaces of a dielectric layer, comprising the steps of:
   (a) providing said layer with a bore extending between said aligned points;
   (b) sandwiching said layer between an upper mask and a lower mask each having a perforation in line with said bore;
   (c) clamping said masks and said layer between two members having an upper chamber and a lower chamber in communication with said perforations;
   (d) filling said lower chamber with a pool of an electrically conductive flowable mass; and
   (e) pressurizing said lower chamber while simultaneously applying suction to said upper chamber to drive some of said mass from said pool upward through said bore via said perforations with resulting conductive bridging of the ends of said bore by a solid plug.

2. The method defined in claim 1 wherein step (e) is followed by at least one reversal of suction and pressure applied to said chambers for generating another flow of said mass through said bore.

3. The method defined in claim 1 or 2 wherein said perforations are empty prior to step (e) and are wider than said bore to enable the accumulation of parts of said mass for producing a two-headed plug.

4. The method defined in claim 1 or 2 wherein the suction applied to said upper chamber exceeds the pressure applied to said lower chamber for substantially compensating the weight of said mass.

* * * * *